US009024436B2

(12) United States Patent
Zhao et al.

(10) Patent No.: US 9,024,436 B2
(45) Date of Patent: May 5, 2015

(54) THERMAL INTERFACE MATERIAL FOR INTEGRATED CIRCUIT PACKAGE

(71) Applicant: Broadcom Corporation, Irvine, CA (US)

(72) Inventors: Sam Ziqun Zhao, Irvine, CA (US); Arpit Mittal, Irvine, CA (US); Rezaur Rahman Khan, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/921,594

(22) Filed: Jun. 19, 2013

(65) Prior Publication Data

US 2014/0374897 A1      Dec. 25, 2014

(51) Int. Cl.
| | |
|---|---|
| H01L 23/34 | (2006.01) |
| H05K 1/02 | (2006.01) |
| H01L 23/373 | (2006.01) |
| H01L 21/02 | (2006.01) |
| H01L 29/06 | (2006.01) |
| H01L 51/00 | (2006.01) |

(52) U.S. Cl.
CPC .......... H05K 1/0203 (2013.01); H01L 23/3735 (2013.01); H01L 21/02112 (2013.01); H01L 29/0669 (2013.01); H01L 51/0048 (2013.01); Y10S 977/742 (2013.01)

(58) Field of Classification Search
CPC ................. H01L 29/0669; H01L 51/0048
USPC .............................. 257/713, E51.04; 977/742
See application file for complete search history.

(56) References Cited

U.S. PATENT DOCUMENTS

| | | | |
|---|---|---|---|
| 7,993,750 B2 | 8/2011 | Wang et al. | |
| 8,129,001 B2 * | 3/2012 | Wang et al. | 427/532 |
| 8,405,996 B2 * | 3/2013 | Shaddock et al. | 361/710 |
| 8,598,689 B2 * | 12/2013 | Sandhu et al. | 257/622 |
| 2004/0182600 A1 * | 9/2004 | Kawabata et al. | 174/250 |
| 2004/0265489 A1 | 12/2004 | Dubin | |
| 2004/0266065 A1 | 12/2004 | Zhang et al. | |
| 2006/0222852 A1 | 10/2006 | Dubin et al. | |
| 2008/0292840 A1 * | 11/2008 | Majumdar et al. | 428/114 |
| 2009/0068387 A1 * | 3/2009 | Panzer et al. | 428/40.1 |
| 2009/0266590 A1 * | 10/2009 | Aoi | 174/257 |
| 2010/0022045 A1 * | 1/2010 | Segal et al. | 438/49 |

(Continued)

OTHER PUBLICATIONS

Andriotis, A.N., et al., "Various Bonding Configurations of Transition-Metal Atoms on Carbon Nanotubes: Their Effect on Contact Resistance," Applied Physics Letters, vol. 76, Published in 2000; pp. 3890-3892.

(Continued)

Primary Examiner — Ida M Soward
(74) Attorney, Agent, or Firm — Sterne, Kessler, Goldstein & Fox P.L.L.C.

(57) ABSTRACT

In an embodiment, a thermal interface material (TIM) is provided. The TIM includes first and a second layers of a first transition metal, and a third layer including a plurality of carbon nanotubes supported in a flexible polymer matrix and a second transition metal coupled to sidewalls of carbon nanotubes. The first and second metal layers are in contact with first and second ends of carbon nanotube. The TIM further includes fourth and fifth layers of an alloy material coupled to the first and second metal layers, respectively. The carbon nanotube based TIM including the layers with transition metal allow improved heat transfer from an integrated circuit die to a heat spreader.

20 Claims, 10 Drawing Sheets

(56) References Cited

U.S. PATENT DOCUMENTS

| | | | | |
|---|---|---|---|---|
| 2010/0108981 A1* | 5/2010 | Jayasekara | ...................... | 257/5 |
| 2011/0057322 A1* | 3/2011 | Matsunaga et al. | ............ | 257/774 |
| 2012/0236502 A1* | 9/2012 | Yamaguchi et al. | ........... | 361/704 |
| 2012/0276327 A1* | 11/2012 | Cola et al. | ...................... | 428/119 |
| 2013/0256868 A1* | 10/2013 | Aliyev | ........................... | 257/713 |
| 2014/0246770 A1* | 9/2014 | Jha et al. | ...................... | 257/712 |

OTHER PUBLICATIONS

Banhart, F., "Interactions Between Metals and Carbon Nanotubes: At the Interface Between Old and New Materials," Nanoscale, vol. 1, Published Aug. 28, 2009; pp. 201-213.

Deretzis, I., et al., "Role of contact bonding on electronic transport in metal-carbon nanotube-metal systems," Nanotechnology, vol. 17, No. 20, Published Sep. 22, 2006; pp. 5063-5072.

He, Yu, et al., "Coating Geometries of Metals on Single-Walled Carbon Nanotubes," Applied Physics Letters 96, Published Feb. 10, 2010; pp. 063108 (1-3).

Lim, Seong Chu, et al., "Contact Resistance Between Metal and Carbon Nanotube Interconnects: Effect of Work Function and Wettability" Applied Physics Letters, vol. 95, Published Dec. 31, 2009; pp. 264103 (1-3).

Maiti, A., et al., "Metal—Nanotube Interactions—Binding Energies and Wetting Properties," Chemical Physics Letters, vol. 395, Issues 1-3, Published Sep. 1, 2004; pp. 7-11.

Ngo, Q., et al., "Electron Transport Through Metal—Multiwall Carbon Nanotube Interfaces," IEEE Transactions of Nanotechnology, vol. 3, No. 2, Published Jun. 2004; pp. 311-317

Panzer, M.A., et al. "Thermal Properties of Metal-Coated Vertically Aligned Single-Wall Nanotube Arrays," Journal of Heat Transfer, vol. 130, Published May 2008; pp. 052401 (1-9)

Prasher, Ravi, "Thermal Interface Materials: Historical Perspective, Status, and Future Directions," Proceedings of the IEEE, vol. 94, No. 8, Published Aug. 2006; pp. 1571-1586.

Rodríguez-Manzo, J.A., et al., "Heterojunctions Between Metals and Carbon Nanotubes as Ultimate Nanocontacts," Proceedings of the National Academy of Sciences (PNAS), vol. 106, No. 12, Published Mar. 9, 2009; pp. 4591-4595.

Shaikh, S., et al., "Thermal Conductivity of an Aligned Carbon Nanotube Array," Carbon, vol. 45, Issue 13, Nov. 2007; pp. 2608-2613.

Xu, Jun, et al., "Enhanced thermal contact conductance using carbon nanotube arrays," Thermal and Thermo mechanical Phenomena in Electronic Systems 2004, ITHERM '04, vol. 2, Published Jun. 2004; pp. 549-555.

Xu, Yuan, et al., "Thermal Properties of Carbon Nanotube Array Used for Integrated Circuit Cooling," Journal of Applied Physics, vol. 100, Published Oct. 4, 2006; pp. 074302-074305.

Zhang, Y., et al., "Heterostructures of Single-Walled Carbon Nanotubes and Carbide Nanorods," Science, vol. 285, No. 5434, Published Sep. 10, 1999; pp. 1719-1722.

* cited by examiner

THERMAL INTERFACE MATERIAL FOR INTEGRATED CIRCUIT PACKAGE

BACKGROUND OF THE DISCLOSURE

1. Field

The present disclosure generally relates to cooling of integrated circuit (IC) devices.

2. Background

Integrated circuit (IC) devices typically include an IC die and a package that houses the IC die. During operation, the IC die can generate significant amount of heat. This heat can cause damage to the IC die or reduce the IC reliability. To conduct heat away from the IC die, the packages often include heat spreading structures. For example, the package can include heat spreader and/or heat slugs attached to the IC die.

Heat spreading structures are often coupled to the surfaces of the IC die to spread heat to the ambient environment. It is desirable to have low contact resistance and good thermal interface between the IC die and the heat spreading structures for efficient heat conduction from the IC die through the heat spreading structures.

BRIEF DESCRIPTION OF THE DRAWINGS/FIGURES

The accompanying drawings illustrate the present disclosure and, together with the description, further serve to explain the principles of the disclosure and to enable one skilled in the pertinent art to make and use the disclosure.

The present disclosure will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION

The following Detailed Description refers to accompanying drawings to illustrate exemplary embodiments consistent with the present disclosure. References in the Detailed Description to "an example embodiment," "an example of this embodiment," etc., indicate that the embodiment described can include a particular feature, device, or characteristic, but every embodiment can not necessarily include the particular feature, device, or characteristic. Moreover, such phrases are not necessarily referring to the same exemplary embodiment. Further, when a particular feature, device, or characteristic is described in connection with an embodiment, it is within the knowledge of those skilled in the relevant art(s) to effect such feature, device, or characteristic in connection with other exemplary embodiments whether or not explicitly described.

Furthermore, it should be understood that spatial descriptions (e.g., "above," "below," "up," "left," "right," "down," "top," "bottom," "vertical," "horizontal," etc.) used herein are for purposes of illustration only, and that practical implementations of the devices described herein can be spatially arranged in any orientation or manner.

The embodiments described herein are provided for illustrative purposes, and are not limiting. Other embodiments are possible, and modifications can be made to the embodiments within the spirit and scope of the present disclosure. Therefore, the Detailed Description is not meant to limit the present disclosure. Rather, the scope of the present disclosure is defined only in accordance with the following claims and their equivalents. It is to be understood that the phraseology or terminology herein is for the purpose of description and not of limitation, such that the terminology or phraseology of the present specification is to be interpreted by those skilled in relevant art(s) in light of the teachings herein.

Figure 1:
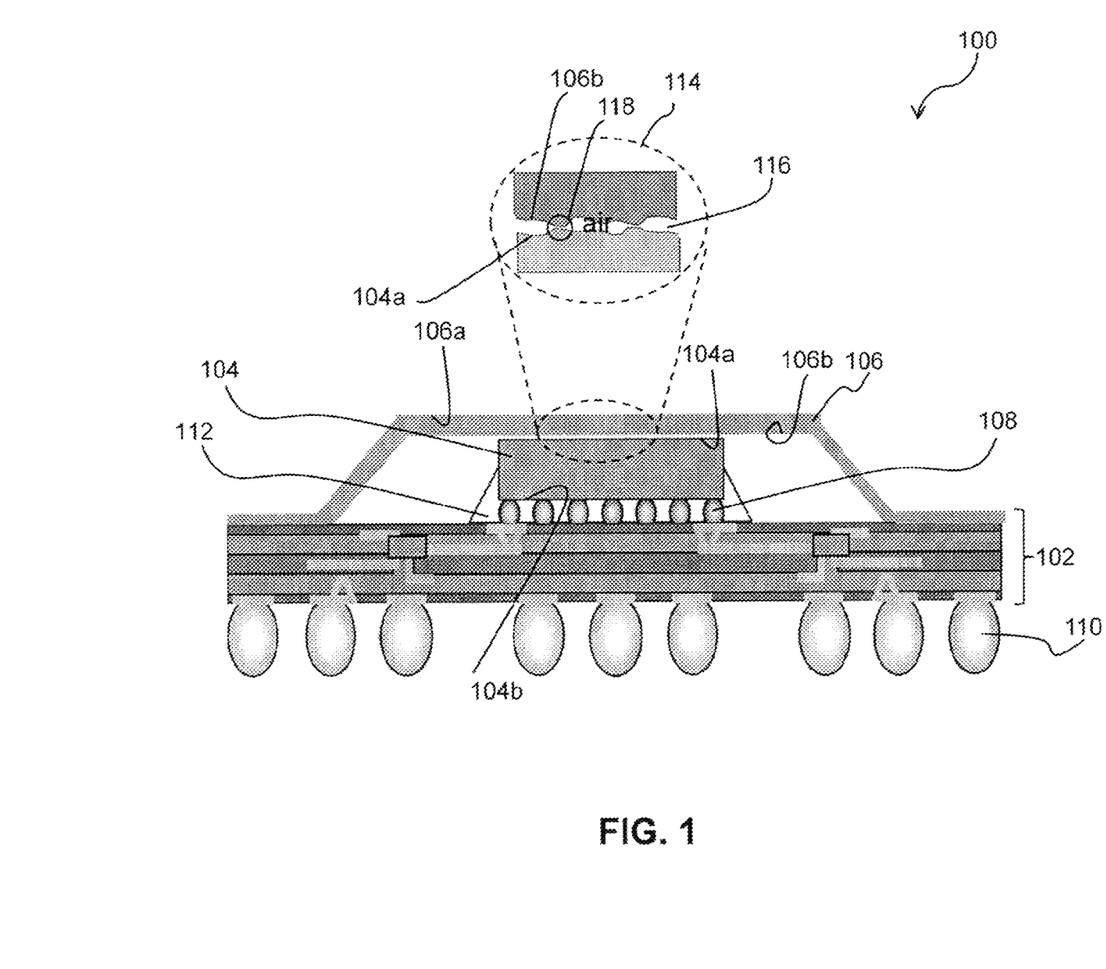
FIGS. 1-2 illustrate schematic diagrams of ball grid array (BGA) IC packages according to various example embodiments.

FIG. 1 illustrates a cross-sectional view of a ball grid array (BGA) IC package 100, according to an example embodiment. IC package 100 includes a substrate 102, an IC die 104, bumps 108, an underfill material 112, and solder balls 110. IC die 104 is electrically coupled to substrate 102 through bumps 108. Solder balls 110 can facilitate electrical interconnection between IC package 100 and a printed circuit board (PCB) (not shown).

As shown in FIG. 1, IC die 104 is attached to substrate 102 in a "flip chip" configuration. In such a configuration, bumps 108 are formed on signal pads or terminals of IC die 104, and IC die 104 may be inverted ("flipped") and attached to substrate 102 by reflowing bumps 108 so that they attach to corresponding pads on the surface of substrate 102.

IC die 104 may be one of the many types of IC dies. For example, IC die 104 may be an application-specific integrated circuit (ASIC) or a memory according to various embodiments. Substrate 102 may be one of the different types of substrates known to those skilled in the relevant arts (e.g., organic or inorganic substrates). Substrate 102 may be made from one or more conductive layers bonded with a dielectric material. For example, the dielectric material may be made from various substances, such as bismaleimide triazine (BT). The conductive layers may be made from a metal, or combination of metals, such as copper and aluminum, that facilitate coupling between IC die 104 and solder balls 110. Trace or routing patterns may be made in the conductive layer by, for example, etching the conductive layer. Substrate 102 may be a single-layer, a two-layer, or multi-layer substrate.

During operation, portions of IC die 104 may generate substantial heat. This heat may cause IC die 104 to overheat if IC package 100 does not include a way to effectively conduct this heat away from IC die 104. At least for that reason, IC package 100 may also include a heat spreader 106 coupled to IC die 104. Heat spreader 106 may be made out of a thermally conductive material (e.g., a metal) and may be coupled to surface 104a of IC die 104. Heat spreader 106 may conduct heat generated by IC die 104 to the ambient environment, thereby cooling IC die 104. Additionally or alternatively, IC package 100 may include a heat sink (e.g., a fin-type heat sink) coupled to surface 106a of heat spreader 106 (not shown).

Although surface 106b of heat spreader 106 may be coupled to surface 104a of IC die 104 to conduct heat away from IC die 104, thermal contact resistance between heat spreader 106 and IC die 104 may cause inefficient heat transfer from IC die 104 to heat spreader 106. Thermal contact resistance between heat spreader 106 and IC die 104 may be present due to the inherent roughness of surfaces 104a and 106b. This surface roughness may create voids 116 at interface 114 between surfaces 104a and 106b, which may be filled with air. As a result, heat transfer from IC die 104 to heat spreader 106 may be due to, for example, heat conduction across contact areas 118 and air filled voids 116 at interface 114. This method of heat transfer may provide non-uniform and inefficient cooling of IC die 104 due to poor thermal conductivity of air (e.g., 0.0026 W/m-K) compared to that of heat spreader 106 (e.g., 400 W/m-K for copper heat spreader). Non-uniform cooling of IC die 104 may further lead to cracks forming on surfaces of IC die due to thermal stress.

Figure 2:
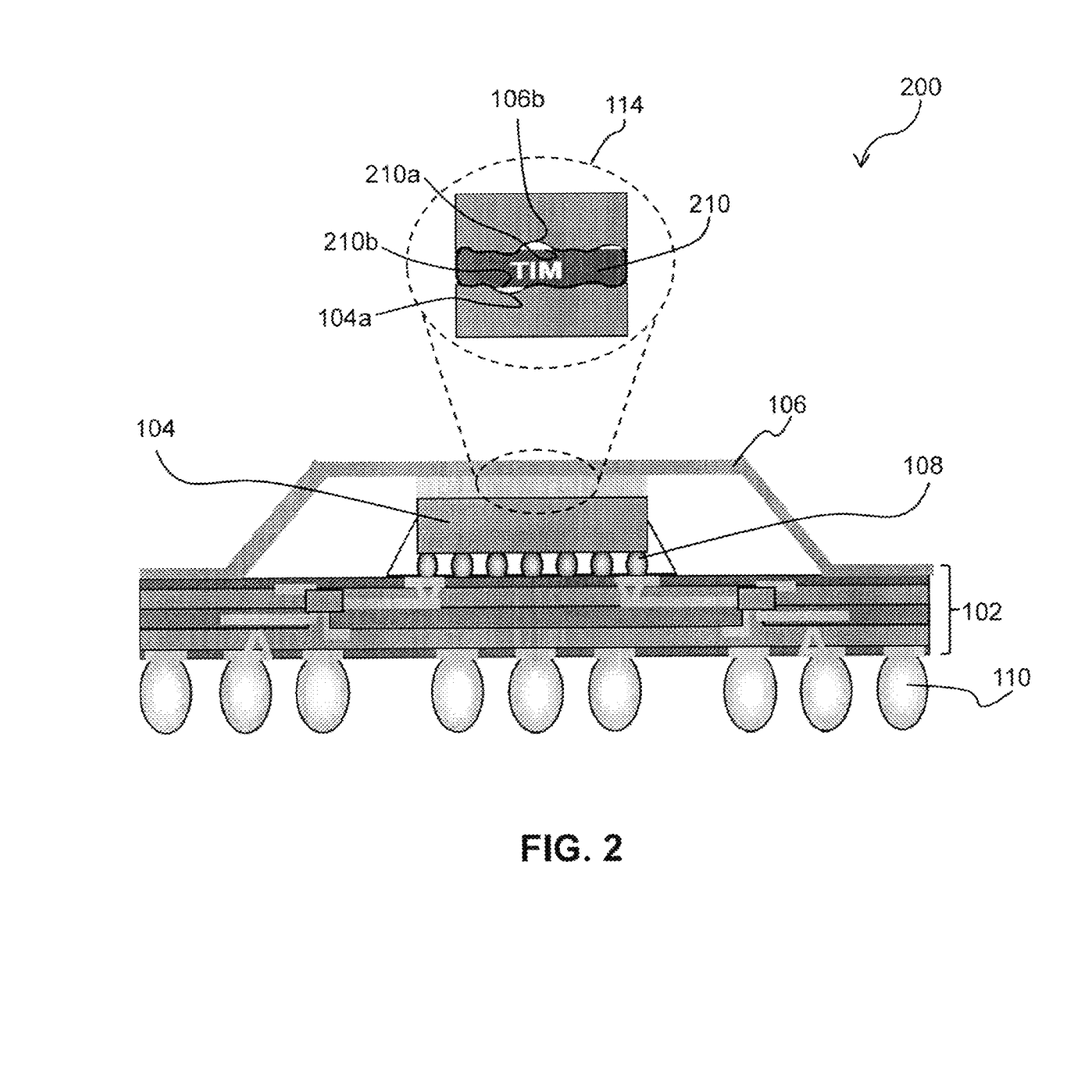

FIG. 2 illustrates a cross-sectional view of a BGA IC package 200 including a thermal interface material (TIM), according to an embodiment. IC packages 100 and 200 are similar, thus only differences between them are to be discussed. In particular, TIM 210 is located at interface 114. First surface 210a of TIM 210 is in contact with surface 106b of heat spreader 106 and second surface 210b of TIM 210 is in contact with surface 104a of IC die 104. This placement of TIM 210 may displace many or most of voids 116 at interface. Because TIM 210 usually has higher thermal conductivity (e.g., >1 W/m-K) than air, TIM 210 reduces thermal resistance to the heat conduction path between IC die 104 and heat spreader 106.

Even though TIM 210 may improve thermal performance of IC package 200 compared to IC packages without TIM 210, a thermal resistance R of TIM 210 may be further reduced to enhance thermal performance of IC package 200. Thermal resistance R may be defined by equation:

$$R = R_{bulk} + R_{contact} = \frac{BLT}{k_{TIM}} + R_{c1} + R_{c2} \quad (1)$$

where BLT is a bond line thickness, $K_{TIM}$ is thermal conductivity of one or more materials forming TIM 210, $R_{c1}$ is contact resistance at an interface between TIM 210 and heat spreader 106, and $R_{c2}$ is contact resistance at an interface between TIM 210 and IC die 104. Reducing contact resistances $R_{c1}$ and $R_{c2}$ may help to reduce thermal resistance R of TIM 210, according to an embodiment.

Figure 3:
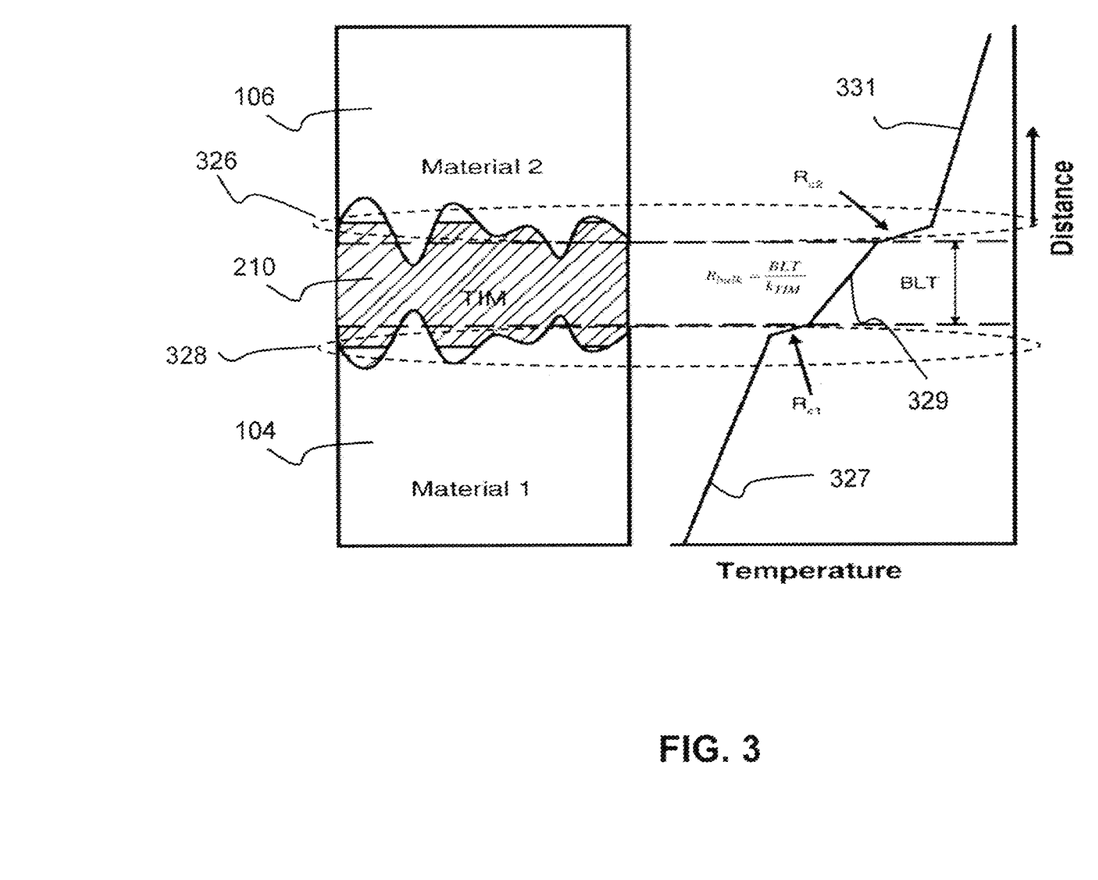
FIG. 3 illustrates a schematic diagram of a plot representing thermal impedance of an example thermal interface material (TIM) according to an embodiment.

FIG. 3 illustrates the dependency of thermal resistance R of TIM 210 on contact resistances $R_{c1}$ and $R_{c2}$. (See Prasher, R., "Thermal Interface Materials: Historical Perspective, Status, and Future Directions," Proceedings of the IEEE, vol. 94, no. 8, August 2006.) Line 327 illustrates that the temperature profile across IC die 104 shifts to lower temperature at interface 328 due to contact resistance $R_{c1}$. Line 329 illustrates that the temperature profile across TIM 210 is further shifted to a lower temperature at interface 326 due to contact resistance $R_{c2}$. Line 331 illustrates the temperature profile across heat spreader 106. Contact resistances $R_{c1}$ and $R_{c2}$ reduce the efficiency with which the temperature in IC die 104 is conducted away in heat spreader 106. Thus, reducing contact resistances may be important in achieving good thermal performance.

Figure 4:
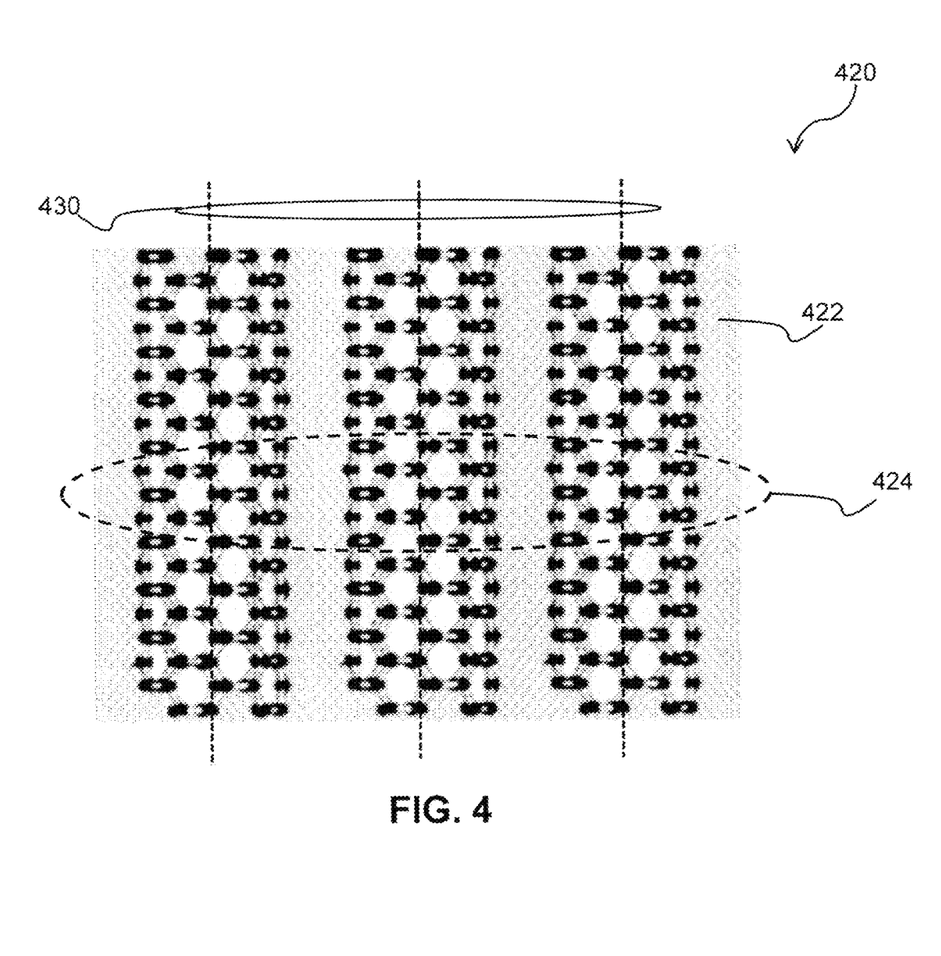
FIGS. 4 and 5 illustrate schematic diagrams of side views of carbon nanotube (CNT) based TIMs according to various example embodiments.

FIG. 4 illustrates a side view of layer 420 including a plurality of CNTs 424 and a matrix material 422, according to an embodiment. In an embodiment, layer 420 can be used as a TIM. Layer 420 is shown including only a CNT array of one row and three columns of CNTs for the sake of simplicity. However, as would be understood by a person of skilled in the art based on the description herein, layer 420 may include any number of CNTs arranged in any number of rows and columns. Plurality of CNTs 424 may be aligned substantially vertically in layer 420 and may be supported by matrix material 422. Matrix material may include, for example, any type of metals, alloys, or polymers. Each CNT of CNTs 424 in layer 420 may be single or multi walled and may have diameters of, for example, 1-2 nm and lengths of, for example, 1-1000 μm.

Each CNT of plurality of CNTs 424 may exhibit high thermal conductivity (e.g., 2000 W/m-K) along their respective axes 430. Layer 420 with plurality of CNTs 424 may exhibit thermal conductivity less than individual CNTs but may still exhibit high thermal conductivity values, for example values ranging from 10 W/m-K~100 W/m-K. However, the thermal impedance R of layer 420 may be much higher than, for example, thermal grease or epoxy based TIMs. This higher thermal impedance of CNT film 420 may be due to higher contact resistance with IC die 104 and heat spreader 106. In particular, when used for TIM 210, there may be plurality of interfaces between each CNT and heat spreader 106 and IC die 104. Thus, layer 420 may have a high thermal resistance R because of higher contact resistances $R_{c1}$ and $R_{c2}$, which themselves may be due to the number of interfaces between layer 420 and heat spreader 106, and layer 420 and IC die 104.

Figures 5, 6, 7:
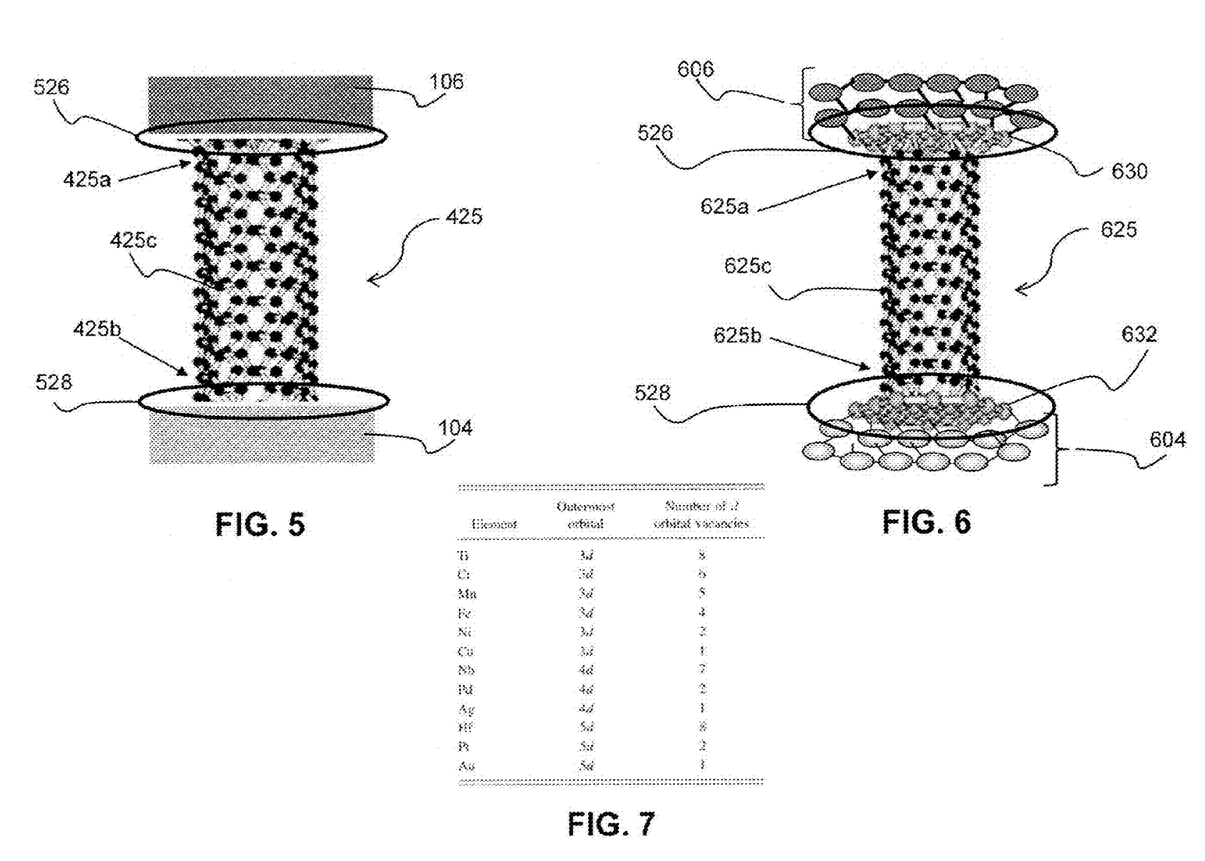
FIG. 6 illustrates a schematic of a side view of a CNT of an example CNT-based TIM according to an embodiment.
FIG. 7 shows a table of transition metals with their d orbital vacancies.

FIG. 5 illustrates a side view of CNT 425 coupled to IC die 104 and heat spreader 106, according to an example embodiment. CNT 425 may represent one or more of each CNT of plurality of CNTs 424 of layer 420 in FIG. 4. CNT 425 includes a first end 425a and a second end 425b. CNT 425 also includes a sidewall 425c forming an outer circumference of the CNT 425.

As shown in the embodiment of FIG. 5, at interface 526 located between first end 425a and heat spreader 106, open bonds of CNT 425 may be in contact with, for example, copper (Cu) material of heat spreader 106. Despite having contact at interface 526, thermal energy carrying electrons travelling from the CNT 425 may not be able to go across interface 526 to the heat spreader 106. These electrons may be lost or scattered within CNT 425, and thus thermal energy may not be conducted away from CNT 425. This scattering of electrons at interface 526 may be due to the carbon bonds of CNT 425 not being bonded (e.g., covalently) with the Cu material of heat spreader 106, and also may be due to the material properties of CNT 425 and heat spreader 106 being different from each other. The scattering of these electrons at interface 526 may limit the transfer of energy from CNT 425 to heat spreader 106 and cause high contact resistance at the interface 526. There may be similar scattering of thermal energy carrying electrons travelling from IC die 104 to CNT 425 across interface 528, which may also cause high contact resistance at interface 528.

FIG. 6 illustrates a side view of a CNT 625, according to an embodiment. CNT 625 is structurally similar to CNT 425 described with reference to FIGS. 4 and 5. CNT 625 is coupled to IC die 604 and heat spreader 606 with respective layers 630 and 632, respectively. Layers 630 and 632 may be referred as first and second "transitional" layers, respectively, and may comprise for example, transition metals such as titanium (Ti), niobium (Nb), hafnium (Hf), or transition metal alloys.

CNT 625 includes a first end 625*a* and a second end 625*b*. CNT 625 also includes a sidewall 625*c* forming an outer circumference of CNT 625. IC die 604 and heat spreader 606 are shown in FIG. 6 using molecular structures that may comprise each element. Layer 630 is coupled to carbon bonds at first end 625*a* and is also coupled to heat spreader 606. Similarly, second layer 632 is coupled to carbon bonds at second end 625*b* and is also coupled to IC die 604. Layers 630 and 632 may provide a conductive bridge across interfaces 526 and 528. The conductive bridge may enhance transfer of energy by increasing the number of thermal energy carrying electrons across interfaces 526 and 528.

The conductive bridge may comprise transition metal-carbon covalent bonds formed between transition metal of layers 630 and 632 and open carbon bonds at the first and second ends 625*a* and 625*b*. The covalent bonds may lead to delocalization of charge across the interfaces 526 and 528, resulting in enhanced energy transfer from IC die 604 to CNT 625 and from CNT 625 to heat spreader 606.

In an embodiment, the bonding between transition metal and the carbon of CNT 625 depends on the number of unfilled d-orbitals in the transition metal. Gold (Au) and Palladium (Pd) have no unfilled d-orbitals and therefore may exhibit a low affinity for carbon. Metals with relatively few vacant d-orbitals, for example, nickel (Ni), iron (Fe), cobalt (Co) may have a higher affinity for carbon, which may also be reflected by the fact that these metals may have a certain (yet low) solubility for carbon. Metals of 3d- and 4d-type with vacant d-orbitals, for example, titanium (Ti), niobium (Nb), hafnium (Hf) may form strong bonds with carbon. In an example, strong metal-carbon bonds can lead to a sufficient solid-state reaction and to the formation of stable covalent bonds between transition metals of layers 630 and 632 and carbon of CNT 625.

FIG. 7 shows a table of transition metals with their d orbital vacancies. (Lim, S. C., Jang, J. H., Bae, D. J., Han, G. H., Lee, S., Yeo, I., and Lee, Y. H., "Contact resistance between metal and carbon nanotube interconnects: Effect of work function and wettability," Applied Physics Letters, Vol. 95, Issue 26, pp 264103-264105, December 2009.) As discussed above, transition metals of layers 630 and 632 may have vacant d orbitals for forming stable covalent bonds at the first and second ends 625*a* and 625*b* of the CNT 625. As shown in the table of FIG. 7, Ti, Hf, and Nb have the largest number of vacant d orbitals. Therefore, covalent bonds between CNT 625 and these metals or their alloys may provide less contact resistance at interfaces 526 and 528.

Figure 8:
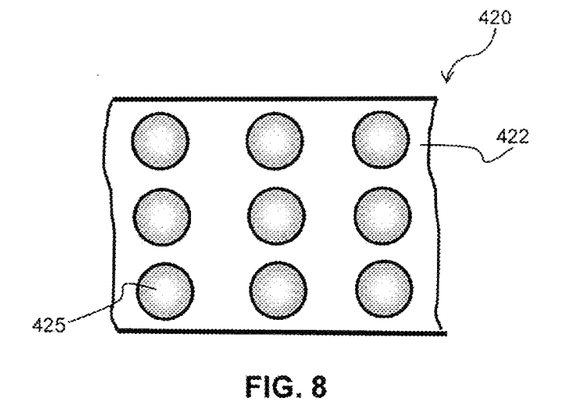
FIGS. 8 and 9 illustrate schematic diagrams of top and side views, respectively, of a CNT-based TIM according to various embodiments.
Figure 9:
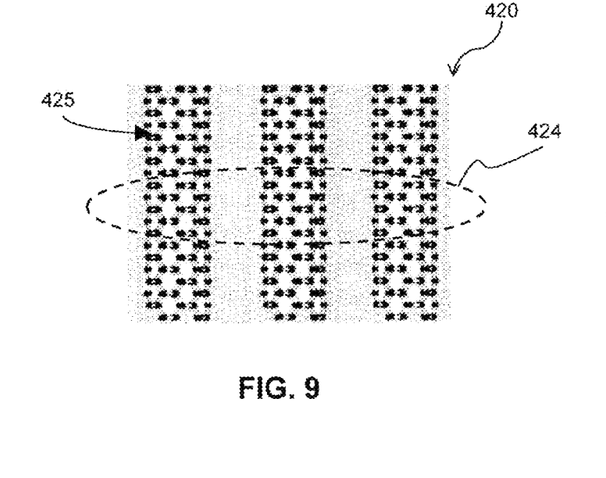
Figure 10:
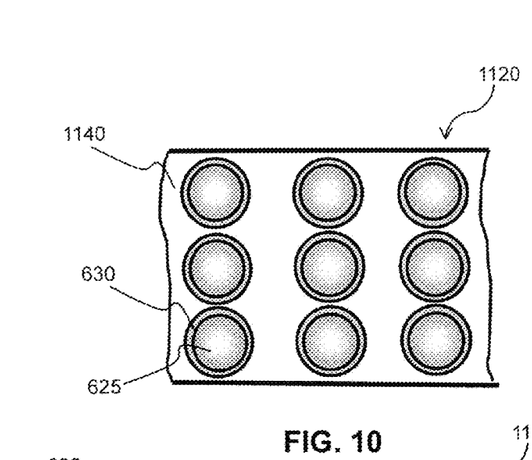
FIGS. 10 and 11 illustrate schematic diagrams of top and side views, respectively, of a CNT-based TIM according to various embodiments.
Figure 11:
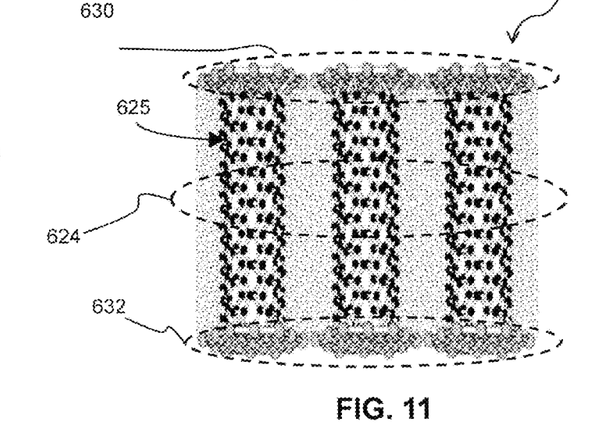

FIGS. 8 and 9 illustrate top and side views, respectively, of layer 420 according to embodiments (layer 420 is described above with reference to FIG. 4). FIGS. 10 and 11 illustrate top and side views, respectively, of a layer 1120, according to embodiments. In an embodiment, layer 1120 can be used as a TIM for an IC package. Layer 1120 includes a plurality of CNTs 1124, a matrix material 1140, and layers 630 and 632. As shown in FIG. 11, plurality of CNTs 1124 is coupled to layers 630 and 632. As noted above, layers 630 and 632 can lower the contact resistance at their respective interfaces, and can thereby improve the heat spreading performance of layer 1120. Matrix material 1140 may comprise a compliant polymer in order to reduce the mechanical modulus and have a flexible layer 1120 based TIM 210.

Figure 12:
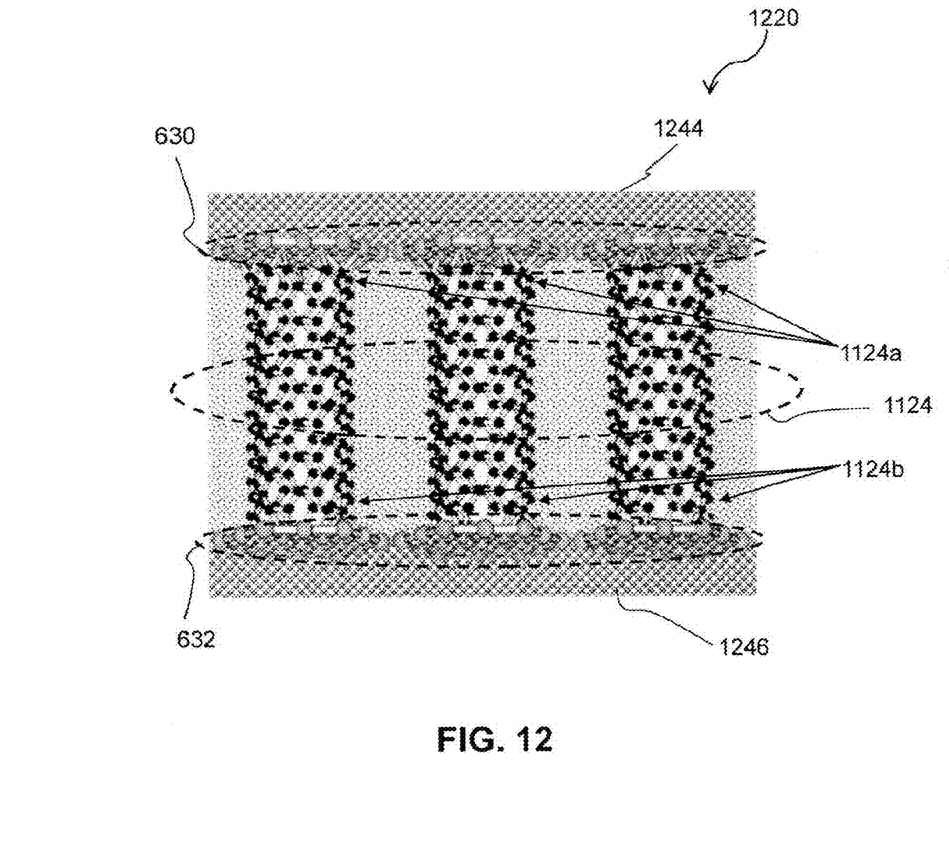
FIG. 12 illustrates a schematic diagram of a side view of a CNT-based TIM according to an embodiment.

FIG. 12 illustrates a side view of layer 1220 according to an embodiment. Layer 1220 may, in an embodiment, be used as a TIM in an IC package. Layer 1220 includes a plurality of CNTs 1124, a matrix material 1140, first and second transitional layers 630 and 632, and first and second low melting point layers 1244 and 1246. As shown in the embodiment of FIG. 12, first and second ends 1124*a* and 1124*b* of plurality of CNTs 1124 are covalently bonded to first and second transitional layers 630 and 632, respectively. A first low melting point layer 1244 is coupled to first layer 630, and a second low melting point layer 1246 is coupled to second layer 632. First and second low melting point layers 1244 and 1246 may comprise, for example, metals, such as indium or tin; alloys, such as indium-tin alloy or tin-gold-copper alloy; and/or solder, such as tin-copper, tin-copper-silver, and tin-lead solder.

In an embodiment, layers 1244 and 1246 may improve bonding between the transitional layers 630 and 632 with materials of respective heat spreader 106 and IC die 104. The transitional layers may not form strong bonds (e.g., covalent bonds) with materials such as Cu or Si. Thus, layers 1244 and 1246 may enhance attachment with heat spreader 106 or IC die 104, and thereby provide improved thermal performance.

Figure 13:
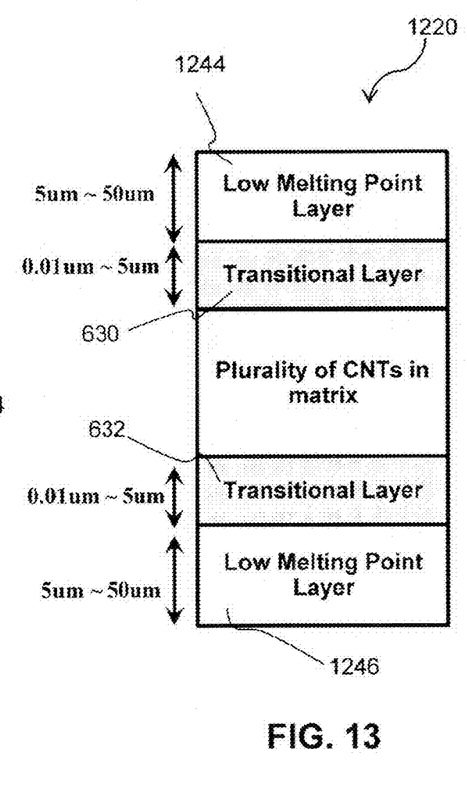
FIG. 13 illustrates a schematic diagram of a CNT-based TIM according to an embodiment.

FIG. 13 shows a schematic diagram of layer 1220, according to an embodiment. The diagram shows a thickness range of layers 630 and 632 (e.g. approximately 0.01-5 μm), and of low melting point material layers 1244 and 1246 (e.g., approximately 5-50 μm) for illustrative purposes. It would be understood by a person skilled in the relevant art that other thicknesses of these layers may be used.

Figure 14:
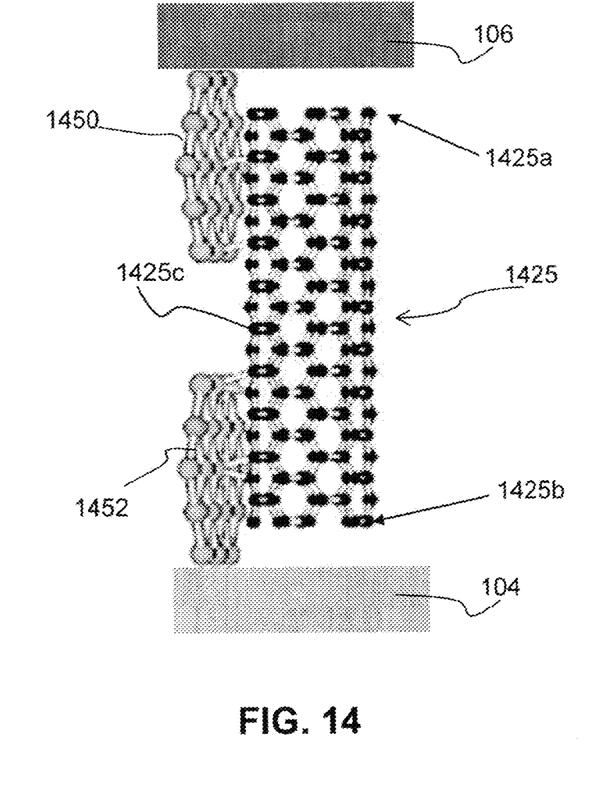
FIG. 14 illustrates a schematic diagram of a side view of a CNT-based TIM according to an embodiment.

FIG. 14 illustrates a side view of a CNT 1425, according to an embodiment. CNT 1425 may, in an embodiment, be used as a part of a layer that functions as a TIM in an IC package. CNT 1425 is similar to CNTs 425 and 625, except that CNT 1425 has a layer 1450 of conductive material coated on a portion of its sidewall 1425*c* near its first end 1425*a*. Similarly, a layer 1452 of conductive material may be coated on a portion of CNT 1425's sidewall 1425*c* near its second end 1425*b*. Layers 1450 and 1452 may extend opposite to each other from sidewall 1425*c* of CNT 1425 to make contact with respective heat spreader 106 and IC die 104. This contact with sidewall 1425*c* of CNT 1425 through layers 1450 and 1452 may allow transfer of heat energy from IC die 104 to heat spreader 106.

Figure 15:
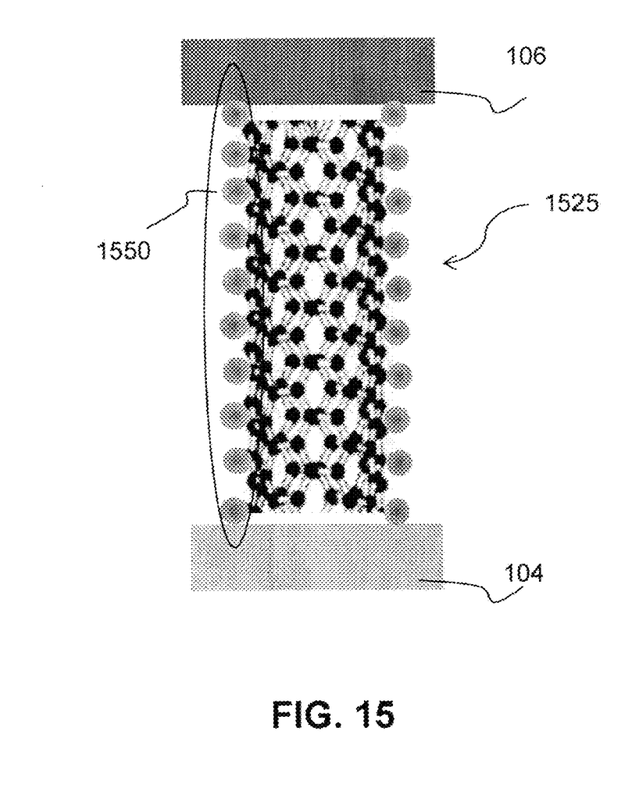
FIG. 15 illustrates a schematic diagram of a side view of a CNT-based TIM according to an embodiment.

FIG. 15 illustrates a side view of a CNT 1525, according to an embodiment. CNT 1525 is similar to CNT 1425, except that conductive layer 1550 is coated on the entire sidewall 1425*c*. For the sake of simplicity, only one CNT has been discussed with respect to layers 1450, 1452, and 1550. However, as would be understood by a person of skill in the art based on the description herein, these layers can be applied to substantially all CNTs of a CNT-based layer similar to 1120 and 1220. Since CNTs may be very small in dimension, it may not be possible to apply the layers 1450, 1452, and 1550 to all CNTs of a CNT-based layer like 1120 and 1220, but only to most of the CNTs.

Layers 1450, 1452, and 1550 may include conductive materials, for example, transition metals such as Ti, Ni, Pd, or their alloys. Sidewall 1425*c* of CNT 1425 may be coated with materials that exhibit good surface wetting properties on carbon sidewall 1425*c*. For example, materials (e.g., metal) with good wetting properties may provide coating of layers on CNT 1425 that may be continuous, while other materials with poor wetting properties lead to isolated islands of material deposited on sidewalls 1425c.

In an example, while coating layers 1450 and 1452 on sidewall 1425c, metal droplets may first collide with CNT 1425. The metal droplets then diffuse on sidewall 1425c and merge together. The nucleation rate and wetting properties of metals coated on sidewall 1425c may be two important factors in determining the final coating geometries. Poor wetting of sidewall 1425c and a high nucleation rate may lead atoms to aggregate more easily to form isolated clusters instead of continuous metal layers on sidewall 1425c, according to an example of this embodiment.

Low surface energy may suggest that metal atoms have a tendency to pile up and form isolated clusters; while low interfacial energy may mean that the metal can be firmly absorbed on sidewall 1425c and tend to spread as a continuous metal layer on sidewall 1425c. In one example, Ti, Ni, and Pd, may form continuous layers on sidewall 1425c due to low interfacial energies between these metal and sidewall 1425c and high diffusion barriers of these metals. Whereas, in another example, Al and Au, due to a small diffusion barrier and high interfacial energy between these metal and sidewall 1425c, these metals may form discontinuous coatings on sidewall 1425c. Similarly for Fe, discontinuous coatings may be formed on the sidewall 1425c even though diffusion barrier of Fe may be quite large. Fe's poor wetting and large cohesion energy may lead to the discontinuous coating.

Figure 16:
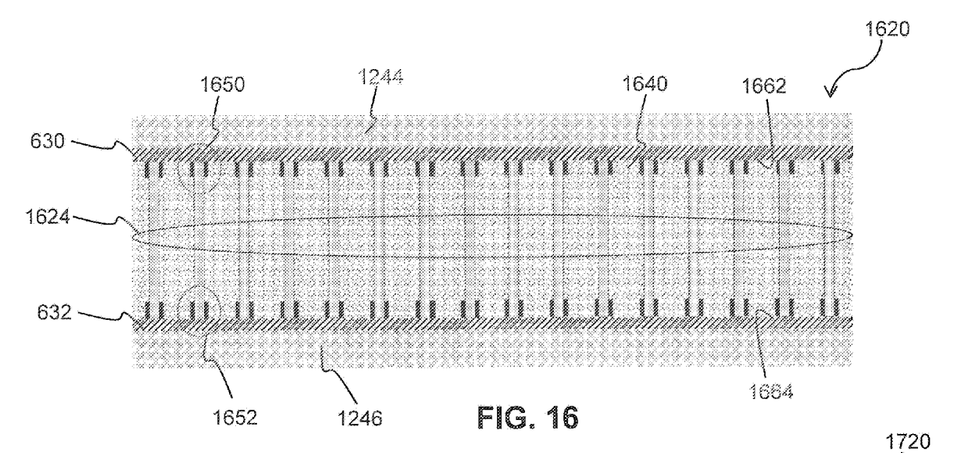
FIG. 16 illustrates a schematic diagram of a cross-sectional view of a CNT film based TIM according an embodiment.

FIG. 16 illustrates a cross sectional view of a layer 1620 according to an embodiment. In an embodiment, layer 1620 may be used as a TIM in an IC package. Layer 1620 include a plurality of CNTs 1624 supported within a compliant matrix material (e.g., polymer) 1140, first and second layers 630 and 632, first and second low melting point layers 1244 and 1246, and a plurality of conductive layers 1650 and 1652 coated on sidewalls 1624c of plurality of CNTs 1624. As shown in FIG. 16, first and second layers 630 and 632 are coupled to first and second ends 1624a and 1624b of plurality of CNTs 1624, respectively. First and second low melting point layers 1244 and 1246 are coupled to transitional layers 630 and 632, respectively, as shown in FIG. 16.

Figure 17:
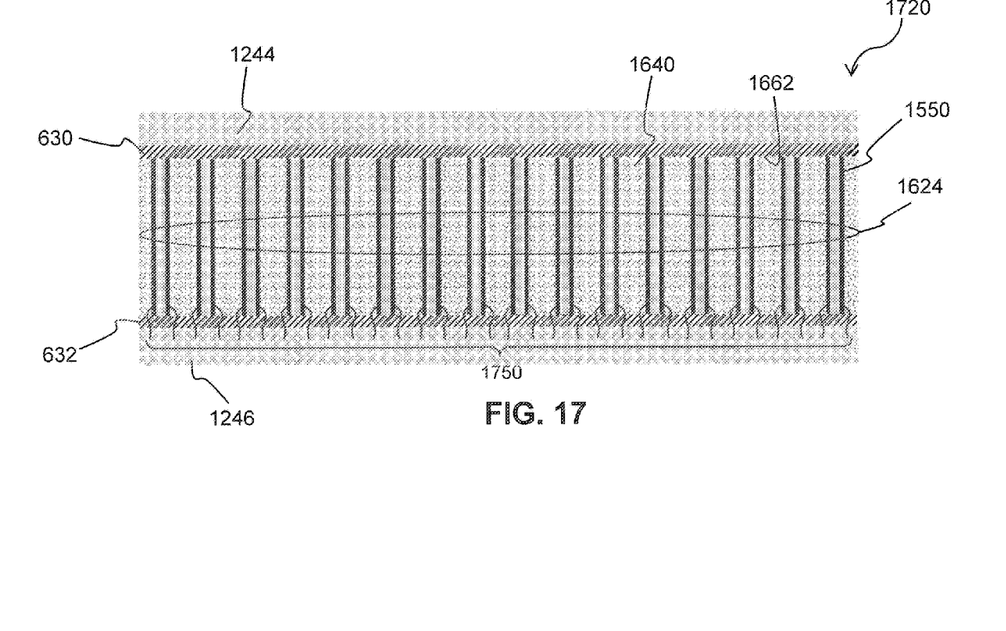
FIG. 17 illustrates a schematic diagram of a cross-sectional view of a CNT film based TIM according to an embodiment.

FIG. 17 illustrates a cross sectional view of a layer 1720 according to an embodiment. In an embodiment, layer 1720 may be used as a TIM in an IC package. Layer 1720 is similar to layer 1620, except that the entire sidewalls 1624c of plurality of CNTs 1624 are coated with a plurality of conductive layers 1750, according to an embodiment. Conductive layer 1550 may represent one or more of the conductive layers of plurality of conductive layers 1750.

Figure 18:
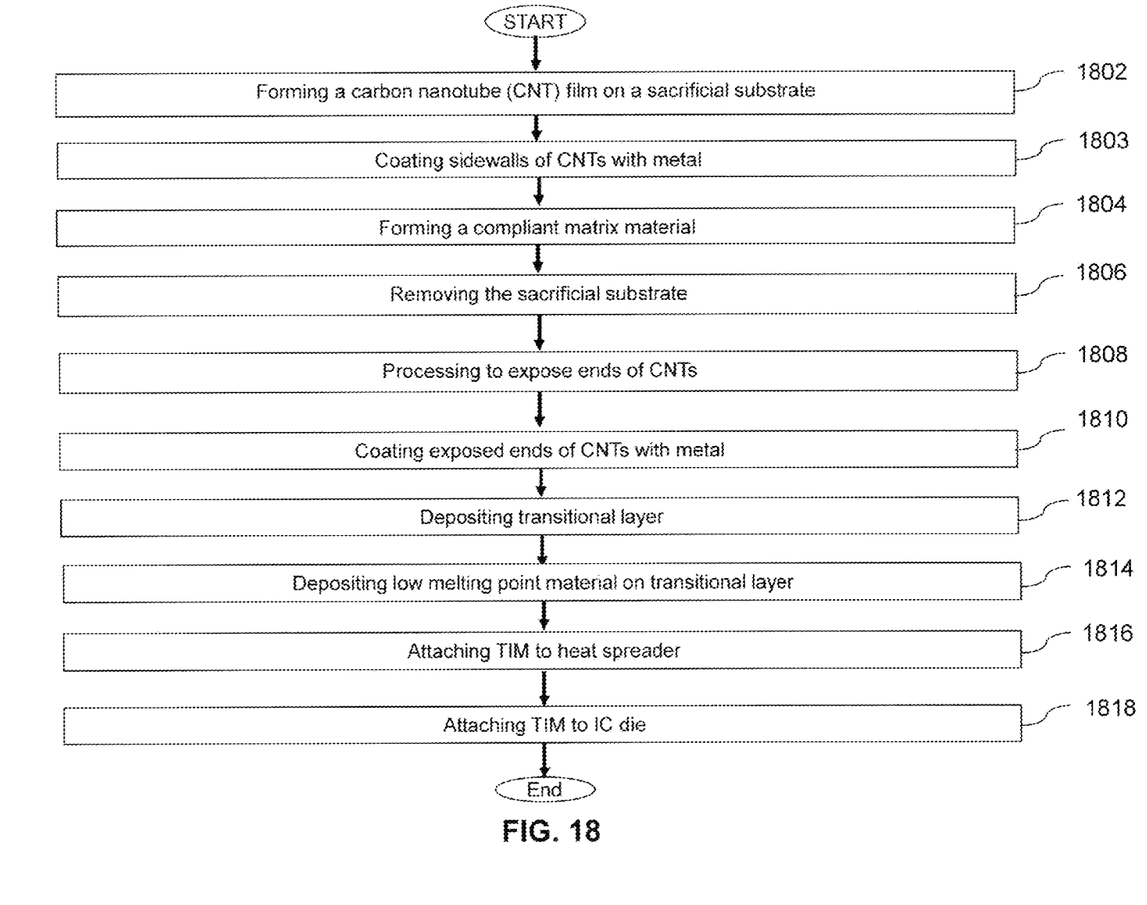
FIG. 18 illustrates a flow chart for a method of processing a CNT film based TIM according to an embodiment.

FIG. 18 illustrates a flow chart providing example steps for manufacturing a CNT based TIM, according to an example embodiment. Other structural and operational embodiments will be apparent to persons skilled in the relevant art(s) based on the following discussion. The steps shown in FIG. 18 do not necessarily have to occur in the order shown, nor do all the steps have to be performed. The steps of FIG. 18 are described in detail below.

In step 1802, a layer including a plurality of CNTs may be formed. For example, plurality of CNTs such as CNTs 424, 1124, 1624 shown in FIGS. 4, 11, 16 may be formed on a sacrificial substrate (e.g., silicon substrate). The film may be grown on the sacrificial substrate by any chemical vapor deposition process, for example, plasma enhanced chemical vapor deposition (PECVD).

In step 1803, sidewalls of the plurality of CNTs may be coated with metal. For example, sidewalls may be coated with metal such as sidewalls 1624c of plurality of CNTs 1624 shown in FIG. 17. The metal may be transition metal such as Ti, Ni, Pd that is deposited by any metal deposition process.

In step 1804, a matrix material may be formed. For example, a matrix material such as matrix material 1140 shown in FIG. 11, 16, or 17 may be formed by dipping the plurality of CNTs formed in step 1802 in a polymer bath. The dipping allows polymer solution to fill the interspaces between CNTs of the plurality of CNTs. The dipping process may be followed by curing of the polymer solution within the interspaces that may solidify to form a compliant matrix material.

In step 1806, the sacrificial substrate may be removed by standard IC manufacturing process.

In step 1808, polymer matrix may be processed to expose ends of CNTs. For example, ends of CNTs such as first and second ends 1124a and 1124b shown in FIG. 12 may be exposed by cutting and etching back cured polymer matrix of step 1806.

In step 1810, ends of CNTs may be coated with metal. For example, ends of CNTs may be coated with conductive materials such as first and second ends 1624a and 1624b of plurality of CNTs 1624 shown in FIG. 16. The conductive material may be transition metals such as Ti, Ni, Pd that is deposited by any metal deposition process.

Steps 1803 and 1810 may be used as optional steps in the manufacturing of a CNT based TIM. For example, step 1803 may be used in the manufacturing of a layer similar to layer 1720 shown in FIG. 17. Step 1810 may be used in the manufacturing of a layer similar to layer 1620 shown in FIG. 16.

In step 1812, transitional layers may be deposited. For example, transitional layers such as transitional layers 630 and 632 shown in FIG. 6, 11, 12, 16, or 17 may be deposited by any deposition process.

In step 1814, low melting point material may be deposited on transitional layers. For example, low melting point material layers such as 1244 and 1246 shown in FIG. 12, 16, or 17 may be deposited by any deposition process of standard IC manufacturing process.

In step 1816, a first side of TIM may be attached to a heat spreader. For example, a first side of TIM such as TIM 210a shown in FIG. 2 may be attached to heat spreader 106.

In step 1818, a second side of TIM may be attached to an IC die. For example, a second side of TIM such as TIM 210b shown in FIG. 2 may be attached to IC die 104. TIM pad or film made from steps in FIG. 18 can also be used for other heat dissipation applications between a heat source and a heat dissipation device such as a heat sink.

It is to be appreciated that the Detailed Description section, and not the Abstract section, is intended to be used to interpret the claims. The Abstract section can set forth one or more, but not all exemplary embodiments, of the present disclosure, and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

It will be apparent to those skilled in the relevant art(s) that various changes in form and detail can be made therein without departing from the spirit and scope of the present disclosure. Thus, the present disclosure should not be limited by any of the above-described exemplary embodiments, but should be defined only in accordance with the following claims and their equivalents.

What is claimed is:

1. A thermal interface material (TIM), comprising:
   first and second layers comprising a first metal; and
   a third layer in contact with the first and second layers, comprising:
   a plurality of carbon nanotubes, wherein each carbon nanotube of the plurality of carbon nanotubes comprises a first end and a second end;
   a second metal in contact with at least a portion of a sidewall of at least one carbon nanotube of the plurality of carbon nanotubes; and
   a matrix material configured to provide flexible support to the plurality of carbon nanotubes.

2. The TIM of claim 1, further comprising:
   a fourth layer in contact with the first layer; and
   a fifth layer in contact with the second layer, wherein each of the fourth and fifth layers comprises an alloy material.

3. The TIM of claim 1, wherein the second metal is in substantial contact with at least a portion of a sidewall of substantially all carbon nanotubes of the plurality of carbon nanotubes.

4. The TIM of claim 1, wherein each of the plurality of carbon nanotubes is configured to be substantially vertically aligned with one or more of the carbon nanotubes of the plurality of carbon nanotubes.

5. The TIM of claim 1, wherein the matrix material comprises a polymer material.

6. The TIM of claim 1, wherein the first metal comprises a transition metal selected from the group consisting of: titanium, niobium, and hafnium.

7. The TIM of claim 1, wherein the second metal comprises a transition metal selected from the group consisting of: titanium, nickel, and palladium.

8. The TIM of claim 2, wherein the alloy material comprises a low melting point alloy selected from the group consisting of: indium, tin, indium-tin, gallium, gold, tin-copper, tin-copper-silver, and tin-lead solder.

9. The TIM of claim 1, wherein the first metal is configured to covalently bond with the first and second ends of substantially all of the plurality of carbon nanotubes.

10. The TIM of claim 1, wherein each of the first and second layers is approximately 0.01 μm to 5 μm.

11. The TIM of claim 1, wherein each of the fourth and fifth layers is approximately 0.5 μm to 50 μm.

12. An integrated circuit (IC) package, comprising:
    a die;
    a heat spreader;
    a thermal interface material (TIM) coupled to the die and the heat spreader comprising:
    a plurality of carbon nanotubes;
    a matrix material configured to support the plurality of carbon nanotubes;
    first and second layers comprising a first transition metal coupled to one or more carbon nanotubes of the plurality of carbon nanotubes; and
    a second transition metal in contact with at least a portion of a sidewall of at least one carbon nanotube of the plurality of the carbon nanotubes.

13. The IC package of claim 12, wherein the TIM further comprises:
    a third layer comprising a non-transition metal coupled to the heat spreader and the first layer; and
    a fourth layer comprising a non-transition metal coupled to the die and the second layer.

14. The IC package of claim 12, wherein the second transition metal is coupled to at least a portion of a sidewall of substantially all carbon nanotubes of the plurality of carbon nanotubes.

15. The IC package of claim 12, wherein the matrix material comprises a polymer material.

16. The IC package of claim 12, wherein the matrix material comprises a low melting point alloy selected from the group consisting of: indium, tin, and indium-tin alloys.

17. A thermal interface material (TIM), comprising:
    a plurality of carbon nanotubes;
    a matrix material configured to support the plurality of carbon nanotubes;
    first and second layers comprising a first metal coupled to one or more carbon nanotubes of the plurality of carbon nanotubes; and
    a second metal in contact with at least a portion of a sidewall of at least one carbon nanotube of the plurality of carbon nanotubes.

18. The TIM of claim 17, wherein the second metal is in substantial contact with at least a portion of a sidewall of substantially all carbon nanotubes of the plurality of carbon nanotubes.

19. The TIM of claim 17, wherein the first metal is configured to covalently bond with the first and second ends of substantially all of the plurality of carbon nanotubes.

20. The TIM of claim 17, further comprising:
    a third layer in contact with the first layer; and
    a fourth layer in contact with the second layer, wherein each of the third and fourth layers comprises an alloy material.

* * * * *